United States Patent
Gill et al.

(10) Patent No.: US 11,728,804 B1
(45) Date of Patent: Aug. 15, 2023

(54) HIGH VOLTAGE SWITCH WITH CASCADED TRANSISTOR TOPOLOGY

(71) Applicant: National Technology & Engineering Solutions of Sandia, LLC, Albuquerque, NM (US)

(72) Inventors: Lee Gill, Albuquerque, NM (US); Luciano Andres Garcia Rodriguez, Albuquerque, NM (US); Jacob Mueller, Albuquerque, NM (US); Jason Christopher Neely, Albuquerque, NM (US)

(73) Assignee: National Technology & Engineering Solutions of Sandia, LLC, Albuquerque, NM (US)

( * ) Notice: Subject to any disclaimer, the term of this patent is extended or adjusted under 35 U.S.C. 154(b) by 2 days.

(21) Appl. No.: 17/737,593

(22) Filed: May 5, 2022

(51) Int. Cl.
*H03K 5/08* (2006.01)
*H03K 17/16* (2006.01)
*H03K 17/687* (2006.01)
*H03K 17/693* (2006.01)
*H03K 17/10* (2006.01)
*H02M 1/088* (2006.01)
*H02M 1/34* (2007.01)

(52) U.S. Cl.
CPC ......... *H03K 17/102* (2013.01); *H02M 1/088* (2013.01); *H02M 1/348* (2021.05)

(58) Field of Classification Search
None
See application file for complete search history.

(56) References Cited

U.S. PATENT DOCUMENTS

| 4,317,055 | A | * | 2/1982 | Yoshida | H03K 17/567 327/566 |
| 4,692,642 | A | * | 9/1987 | Fukuzo | H03K 3/356095 327/63 |
| 4,751,408 | A | * | 6/1988 | Rambert | H03K 17/102 327/581 |

(Continued)

OTHER PUBLICATIONS

Shukla and G. D. Demetriades, "A Survey on Hybrid Circuit-Breaker Topologies", IEEE Transactions on Power Delivery, vol. 30, No. 2, pp. 627-641, Apr. 2015.

(Continued)

*Primary Examiner* — Kenneth B Wells
(74) *Attorney, Agent, or Firm* — Mark A. Dodd

(57) ABSTRACT

A switching apparatus includes three or more series-connected transistors, and it further includes a balancing network. The balancing network includes a resistor network configured to divide a voltage from a voltage source across the series-connected transistors. The resistor network includes at least two resistive legs connected in parallel. In each resistive leg, two or more resistors are connected in series. The balancing network may further comprise at least one capacitive leg of series-connected capacitors connected across the series-connected transistors, and it may further comprise at least one leg of series-connected avalanche diodes connected across the series-connected transistors for overvoltage protection. In example embodiments, the series-connected transistors are JFETs. In other example embodiments, the series-connected transistors may be HEMTs or GaN transistors.

16 Claims, 9 Drawing Sheets

(56) References Cited

U.S. PATENT DOCUMENTS

| | | | | |
|---|---|---|---|---|
| 4,893,070 | A * | 1/1990 | Milberger | G05F 1/613 323/350 |
| 5,804,815 | A | 9/1998 | Loubriel et al. | |
| 6,633,195 | B2 * | 10/2003 | Baudelot | H03K 17/168 327/434 |
| 6,659,929 | B1 * | 12/2003 | Jaksch | B65C 9/1865 493/376 |
| 6,822,842 | B2 * | 11/2004 | Friedrichs | H03K 17/102 361/111 |
| 7,082,020 | B2 * | 7/2006 | Friedrichs | H03K 17/08128 257/E27.059 |
| 8,455,948 | B2 * | 6/2013 | Weis | H01L 23/528 257/77 |
| 8,569,842 | B2 * | 10/2013 | Weis | H01L 27/0886 257/272 |
| 8,723,589 | B2 * | 5/2014 | Biela | H03K 17/102 327/436 |
| 8,759,939 | B2 * | 6/2014 | Weis | H01L 27/105 257/E27.033 |
| 8,866,253 | B2 * | 10/2014 | Weis | H01L 21/84 257/E27.033 |
| 8,912,840 | B2 * | 12/2014 | Aggeler | H03K 17/102 327/430 |
| 8,970,262 | B2 * | 3/2015 | Weis | H01L 29/7838 327/108 |
| 8,995,158 | B2 * | 3/2015 | Weis | H03K 17/102 363/127 |
| 9,035,690 | B2 * | 5/2015 | Weis | H03K 17/102 327/427 |
| 9,190,993 | B1 * | 11/2015 | Li | H03K 17/102 |
| 9,312,847 | B1 * | 4/2016 | Li | H03K 17/60 |
| 9,484,834 | B2 * | 11/2016 | Weis | H03K 17/102 |
| 9,496,859 | B2 * | 11/2016 | Weis | H03K 17/687 |
| 9,530,764 | B2 * | 12/2016 | Weis | H01L 29/78 |
| 9,659,929 | B2 * | 5/2017 | Weis | H01L 27/0883 |
| 9,859,274 | B2 * | 1/2018 | Weis | H03K 17/102 |
| 9,866,213 | B1 * | 1/2018 | Zhang | H01L 24/29 |
| 9,972,619 | B2 * | 5/2018 | Weis | H01L 23/528 |
| 2020/0382118 | A1 | 12/2020 | Voss et al. | |

OTHER PUBLICATIONS

R. Rodrigues, Y. Du, A. Antoniazzi and P. Cairoli, "A Review of Solid-State Circuit Breakers", IEEE Transactions on Power Electronics, vol. 36, No. 1, pp. 364-377, Jan. 2021.

R. Wang, B. Zhang, S. Zhao, L. Liang and Y. Chen, "Design of an IGBT-series-based Solid-State Circuit Breaker for Battery Energy Storage System Terminal in Solid-State Transformer", IECON 2019—45th Annual Conference of the IEEE Industrial Electronics Society, pp. 6677-6682, 2019.

O. A. Ciniglio, D. P. Carroll and H. Mehta, "The application of photoconductive switches in HVDC circuit interruption," in IEEE Transactions on Power Delivery, vol. 5, No. 1, pp. 460-466, Jan. 1990, doi: 10.1109/61.107313.

Andrew D. Koehler et al., "High Voltage GaN Lateral Photoconductive Semiconductor Switches," ECS Journal of Solid State Science and Technology, 6 (11) S3099-S3102 (2017), 5 pages.

G.W. Pickrell et al., "Advanced GaN Device Technologies for Power Electronics," SAND2018-10913C, Sandia National Laboratories (2018), 27 pages.

G.M. Loubriel et al., "Photoconductive Semiconductor Switches: Laser Q-switch Trigger and Switch-Trigger Laser Integration," SAND97-3111, Sandia National Laboratories (1997), 28 pages.

G. Pickrell et al., "ARC-SAFE: Accelerated Response Semiconducting Contactors and Surge Attenuation For DC Electrical Systems," SAND2020-8298PE, Sandia National Laboratories (2020), 20 pages.

Garcia Rodriguez, L. Gill, J. Mueller and J. Neely, "A High-Voltage Cascaded Solid-State DC Circuit Breaker Using Normally-ON SiC JFETs," 2021 IEEE 12th Energy Conversion Congress & Exposition—Asia (ECCE-Asia), 2021, pp. 1554-1561, doi: 10.1109/ECCE-Asia49820.2021.9479388 (Date of Conference: May 24-27, 2021).

L. Gill, L. A. G. Rodriguez, J. Mueller and J. Neely, "A Comparative Study of SiC JFET Super-Cascode Topologies," 2021 IEEE Energy Conversion Congress and Exposition (ECCE), 2021, pp. 1741-1748, doi: 10.1109/ECCE47101.2021.9595065 (Date of Conference: Oct. 10-14, 2021).

P. Friedrichs, H. Mitlehner, R. Schorner, K. -. Dohnke, R. Elpelt and D. Stephani, "Stacked high voltage switch based on SiC VJFETs", ISPSD '03. 2003 IEEE 15th International Symposium on Power Semiconductor Devices and ICs 2003. Proceedings, pp. 139-142, 2003.

J. Biela, D. Aggeler, D. Bortis and J. W. Kolar, "Balancing Circuit for a 5-kV/50-ns Pulsed-Power Switch Based on SiC-JFET Super Cascode", IEEE Transactions on Plasma Science, vol. 40, No. 10, pp. 2554-2560, Oct. 2012.

J. Biela, D. Aggeler, D. Bortis and J. W. Kolar, "5kV/200ns Pulsed Power Switch based on a SiC-JFET Super Cascode", 2008 IEEE International Power Modulators and High-Voltage Conference, pp. 358-361, 2008.

D. Aggeler, F. Canales, J. Biela and J. W. Kolar, "Dv/ Dt -Control Methods for the SiC JFET/Si MOSFET Cascode", IEEE Transactions on Power Electronics, vol. 28, No. 8, pp. 4074-4082, Aug. 2013.

D. Aggeler, J. Biela and J. W. Kolar, "A compact high voltage 25 kW 50 kHz DC-DC converter based on SiC JFETs", 2008 Twenty-Third Annual IEEE Applied Power Electronics Conference and Exposition, pp. 801-807, 2008.

D. Aggeler, J. Biela and J. W. Kolar, "Controllable dv/dt behaviour of the SiC MOSFET/JFET cascode an alternative hard commutated switch for telecom applications", 2010 Twenty-Fifth Annual IEEE Applied Power Electronics Conference and Exposition (APEC), pp. 1584-1590, 2010.

Gao, A. J. Morgan, Y. Xu, X. Zhao and D. C. Hopkins, "6.0kV 100A 175kHz super cascode power module for medium voltage high power applications", 2018 IEEE Applied Power Electronics Conference and Exposition (APEC), pp. 1288-1293, 2018.

Gao, A. Morgan, Y. Xu, X. Zhao, B. Ballard and D. C. Hopkins, "6.5kV SiC JFET-based Super Cascode Power Module with High Avalanche Energy Handling Capability", 2018 IEEE 6th Workshop on Wide Bandgap Power Devices and Applications (WiPDA), pp. 319-322, 2018.

X. Ni, R. Gao, X. Song, A. Q. Huang and W. Yu, "Development of 6kV SiC hybrid power switch based on 1200V SiC JFET and MOSFET", 2015 IEEE Energy Conversion Congress and Exposition (ECCE), pp. 4113-4118, 2015.

X. Song, A. Q. Huang, S. Sen, L. Zhang, P. Liu and X. Ni, "15-kV/40-A FREEDM Supercascode: A Cost-Effective SiC High-Voltage and High-Frequency Power Switch", IEEE Transactions on Industry Applications, vol. 53, No. 6, pp. 5715-5727, Nov.-Dec. 2017.

L. Garcia Rodriguez, L. Gill, J. Mueller and J. Neely, "A High-Voltage Cascaded Solid-State DC Circuit Breaker Using Normally-On SiC JFETs", 2021 12th Energy Conversion Congress and Exposition Asia (ECCE Asia), 2021.

L. Zhang, S. Sen and A. Q. Huang, "7.2-kV/60-A Austin SuperMOS: An Intelligent Medium-Voltage SiC Power Switch", IEEE Journal of Emerging and Selected Topics in Power Electronics, vol. 8, No. 1, pp. 6-15, Mar. 2020.

L. Zhang, S. Sen, Z. Guo, X. Zhao, A. Q. Huang and X. Song, "7.2-kV/60-A Austin SuperMOS: An Enabling SiC Switch Technology for Medium Voltage Applications", 2019 IEEE Electric Ship Technologies Symposium (ESTS), pp. 523-529, 2019.

X. Lyu, H. Li, Z. Ma, B. Hu and J. Wang, "Dynamic Voltage Balancing for the High-Voltage SiC Super-Cascode Power Switch," in IEEE Journal of Emerging and Selected Topics in Power Electronics, vol. 7, No. 3, pp. 1566-1573, Sep. 2019.

X. Lyu, H. Li, Z. Ma, B. Hu and J. Wang, "Optimization Method to Eliminate Turn-on Overvoltage Issue of the High Voltage SiC Super-Cascode Power Switch", 2018 IEEE 4th Southern Power Electronics Conference (SPEC), pp. 1-6, 2018.

(56) References Cited

OTHER PUBLICATIONS

B. Hu et al., "Characterization and evaluation of 4.5 kV 40 A SiC super-cascode device", 2017 IEEE 5th Workshop on Wide Bandgap Power Devices and Applications (WiPDA), pp. 321-326, 2017.
X. Lyu, H. Li, B. Hu, Z. Ma and J. Wang, "High voltage SiC super-cascode power switch parameter optimization for loss reduction", 2018 IEEE Applied Power Electronics Conference and Exposition (APEC), pp. 1701-1705, 2018.
Bhalla, X. Li, P. Losee and M. Nava, "Ultra-High Voltage (40kV) Switches Implemented using SiC Super Cascodes", PCIM Europe 2019; International Exhibition and Conference for Power Electronics Intelligent Motion Renewable Energy and Energy Management, pp. 1-6, 2019.
X. Li, H. Zhang, P. Alexandrov and A. Bhalla, "Medium voltage power switch based on SiC JFETs", 2016 IEEE Applied Power Electronics Conference and Exposition (APEC), pp. 2973-2980, 2016.
P. Killeen, A. N. Ghule and D. C. Ludois, "Silicon Carbide JFET Super-Cascodes for Normally-On Current Source Inverter Switches in Medium Voltage Variable Speed Electrostatic Drives", 2019 IEEE Energy Conversion Congress and Exposition (ECCE), pp. 4004-4011, 2019.
J. L. Hostetler, P. Alexandrov, X. Li, L. Fursin and A. Bhalla, "6.5 kV SiC normally-off JFETs—Technology status", 2014 IEEE Workshop on Wide Bandgap Power Devices and Applications, pp. 143-146, 2014.
M. Roshandeh, Z. Miao, Z. A. Danyial, Y. Feng and Z. J. Shen, "Cascaded operation of SiC JFETs in medium voltage solid state circuit breakers", 2016 IEEE Energy Conversion Congress and Exposition (ECCE), pp. 1-6, 2016.
X. Zhang, Z. Yu, Z. Chen, Y. Huang, B. Zhao and R. Zeng, "Modular Design Methodology of DC Breaker Based on Discrete Metal Oxide Varistors With Series Power Electronic Devices for HVdc Application", IEEE Transactions on Industrial Electronics, vol. 66, No. 10, pp. 7653-7662, Oct. 2019.
Z. J. Shen, G. Sabui, Z. Miao and Z. Shuai, "Wide-Bandgap Solid-State Circuit Breakers for DC Power Systems: Device and Circuit Considerations", IEEE Transactions on Electron Devices, vol. 62, No. 2, pp. 294-300, Feb. 2015.
He, Z. Shuai, Z. Lei, W. Wang, X. Yang and Z. J. Shen, "A SiC JFET-Based Solid State Circuit Breaker With Digitally Controlled Current-Time Profiles", IEEE Journal of Emerging and Selected Topics in Power Electronics, vol. 7, No. 3, pp. 1556-1565, Sep. 2019.
Z. Miao, G. Sabui, A. Moradkhani Roshandeh and Z. J. Shen, "Design and Analysis of DC Solid-State Circuit Breakers Using SiC JFETs", IEEE Journal of Emerging and Selected Topics in Power Electronics, vol. 4, No. 3, pp. 863-873, Sep. 2016.
Zhang, X. Yang, W. Chen and L. Wang, "Voltage Balancing Control of Series-Connected SiC MOSFETs by Using Energy Recovery Snubber Circuits", IEEE Transactions on Power Electronics, vol. 35, No. 10, pp. 10200-10212, Oct. 2020.
Y. Ren et al., "Stability Analysis and Improvement for SSCB With Single-Gate Controlled Series-Connected SiC MOSFETs", IEEE Transactions on Industrial Electronics, vol. 68, No. 9, pp. 8093-8103, Sep. 2021.
L. Mackey, C. Peng and I. Husain, "A Progressive Switching Scheme for Solid-State DC Circuit Breakers", 2018 9th IEEE International Symposium on Power Electronics for Distributed Generation Systems (PEDG), pp. 1-6, 2018.
C. Abbate, G. Busatto and F. Iannuzzo, "High-Voltage High-Performance Switch Using Series-Connected IGBTs", IEEE Transactions on Power Electronics, vol. 25, No. 9, pp. 2450-2459, Sep. 2010.
R. Withanage and N. Shammas, "Series Connection of Insulated Gate Bipolar Transistors (IGBTs)", IEEE Transactions on Power Electronics, vol. 27, No. 4, pp. 2204-2212, Apr. 2012.
T. C. Lim, B. W. Williams, S. J. Finney and P. R. Palmer, "Series-Connected IGBTs Using Active Voltage Control Technique", IEEE Transactions on Power Electronics, vol. 28, No. 8, pp. 4083-4103, Aug. 2013.
J. Liu, L. Ravi, D. Dong and R. Burgos, "A Single Passive Gate-Driver for Series-Connected Power Devices in DC Circuit Breaker Applications", IEEE Transactions on Power Electronics, vol. 36, No. 10, pp. 11031-11035, Oct. 2021.
X. Wu, S. Cheng, Q. Xiao and K. Sheng, "A 3600 V/80 A Series—Parallel-Connected Silicon Carbide MOSFETs Module With a Single External Gate Driver", IEEE Transactions on Power Electronics, vol. 29, No. 5, pp. 2296-2306, May 2014.
Y. Ren et al., "A Compact Gate Control and Voltage-Balancing Circuit for Series-Connected SiC MOSFETs and Its Application in a DC Breaker", IEEE Transactions on Industrial Electronics, vol. 64, No. 10, pp. 8299-8309, Oct. 2017.
Y. Ren, X. Yang, F. Zhang, F. Wang, L. M. Tolbert and Y. Pei, "A Single Gate Driver Based Solid-State Circuit Breaker Using Series Connected SiC MOSFETs", IEEE Transactions on Power Electronics, vol. 34, No. 3, pp. 2002-2006, Mar. 2019.
C. Li, S. Chen, H. Luo, C. Li, W. Li and X. He, "A Modified RC Snubber With Coupled Inductor for Active Voltage Balancing of Series-Connected SiC MOSFETs", IEEE Transactions on Power Electronics, vol. 36, No. 10, pp. 11208-11220, Oct. 2021.
V. Jones, R. A. Fantino and J. C. Baida, "A Modular Switching Position With Voltage-Balancing and Self-Powering for Series Device Connection", IEEE Journal of Emerging and Selected Topics in Power Electronics, vol. 9, No. 3, pp. 3501-3516, Jun. 2021.
L. Pang, T. Long, K. He, Y. Huang and Q. Zhang, "A Compact Series-Connected SiC MOSFETs Module and Its Application in High Voltage Nanosecond Pulse Generator", IEEE Transactions on Industrial Electronics, vol. 66, No. 12, pp. 9238-9247, Dec. 2019.
Marzoughi, R. Burgos and D. Boroyevich, "Active Gate-Driver With dv/dt Controller for Dynamic Voltage Balancing in Series-Connected SiC MOSFETs", IEEE Transactions on Industrial Electronics, vol. 66, No. 4, pp. 2488-2498, Apr. 2019.
X. Yao, "Study on DC arc faults in ring-bus DC microgrids with constant power loads", 2016 IEEE Energy Conversion Congress and Exposition (ECCE), pp. 1-5, 2016.
M. E. Baran and N. R. Mahajan, "DC distribution for industrial systems: opportunities and challenges", IEEE Transactions on Industry Applications, vol. 39, No. 6, pp. 1596-1601, Nov.-Dec. 2003.
Z. J. Shen, A. M. Roshandeh, Z. Miao and G. Sabui, "Ultrafast autonomous solid state circuit breakers for shipboard DC power distribution", 2015 IEEE Electric Ship Technologies Symposium (ESTS), pp. 299-305, 2015.
X. Pei, O. Cwikowski, D. S. Vilchis-Rodriguez, M. Barnes, A. C. Smith and R. Shuttleworth, "A review of technologies for MVDC circuit breakers", IECON 2016—42nd Annual Conference of the IEEE Industrial Electronics Society, pp. 3799-3805, 2016.

\* cited by examiner

HIGH VOLTAGE SWITCH WITH CASCADED TRANSISTOR TOPOLOGY

NOTICE OF GOVERNMENT RIGHTS

This invention was made with Government support under Contract No. DE-NA0003525 awarded by the United States Department of Energy/National Nuclear Security Administration. The Government has certain rights in the invention.

FIELD OF THE INVENTION

The present disclosure relates to wide-bandgap power semiconductor devices. In a more particular aspect, the disclosure relates to apparatus in which such devices are used for high-voltage switching.

ART BACKGROUND

It has long been known that a junction field-effect transistor (JFET) fabricated from a wide-bandgap material such as silicon carbide (SiC) offers certain advantages when it is used as a high-voltage switching device, particularly for high-power applications. Recognized advantages of a JFET based, e.g., on SiC, include low on-resistance per chip area and high breakdown voltage. Because both the output capacitance and the Miller capacitance tend to be relatively low, another potential advantage is low switching loss. It has also been recognized that because a typical JFET lacks a gate oxide layer, it can potentially be more reliable than a comparable MOSFET under severe conditions that could cause a gate oxide to degenerate.

However, the SiC JFET operates in depletion mode. Because of that, its inherent operating mode is normally-on. As such, the JFET requires active application of a negative gate voltage to turn it OFF and to maintain it in the OFF condition. This can be inconvenient for some applications. Further, it can pose a safety risk because a fault in the control circuit could potentially create an unintended conductive path for high current at high voltage.

For those reasons, among others, it has been conventional to add a controlling transistor in the form of a low-voltage MOSFET, which is a normally-off transistor. The control signal takes the form of a gating potential applied across the gate and source of the MOSFET. Under the control of the MOSFET, the resulting circuit has normally-off behavior.

The term "cascode" has been applied to denote circuit configurations in which the switching behavior of a single JFET is controlled by a MOSFET, such as a low-voltage silicon or SiC MOSFET. It is also possible to cascade multiple JFETs in order to increase the voltage rating of the switch circuit. SiC JFETs, in particular, are advantageous in this regard because of the advantages mentioned above. The term "super cascode" has been applied to denote circuit configurations in which a MOSFET is used as the control device to control two or more JFETs that are cascaded in series. By "series" in this regard, we mean that the drain terminal of each JFET is connected to the source terminal of the next JFET in sequence.

A useful review of several different super cascode configurations can be found in L. Gill et al., "A Comparative Study of SiC JFET Super-Cascode Topologies," 2021 *IEEE Energy Conversion Congress and Exposition (ECCE)* (2021) 1741-1748, the entirety of which is hereby incorporated herein by reference.

Super cascode configurations are beneficial because they combine some of the advantages that cascaded JFETs offer with the safety and convenience provided by using a MOSFET for control. However, it is typical for the control device to be a low-voltage silicon MOSFET. The voltage rating of such a device must be considered in the design of the super cascode circuit, which consequently limits the voltage rating of the switch as a whole.

Further, disparities both in the voltage rating and in the on-resistance between the MOSFET and the JFETs tend to complicate the circuit design, and physically, they may lead to serious localized thermal stresses. The controlling MOSFET may also be subject to failure due to degradation of the gate oxide, as mentioned above.

There is, then, a need for new circuit configurations for high-voltage switching that can extend the capabilities of cascaded JFETs.

SUMMARY OF THE INVENTION

We have provided a new switch topology, in which a cascaded JFET configuration or other transistor configuration is operated without using a control MOSFET or other added control device. This can provide several benefits, including a more uniform thermal distribution across the devices which can, in turn, facilitate better thermal management. Moreover, absent the MOSFET, the full benefit of the low on-resistance of the cascaded JFETs or other transistors can be realized. Further, the resilience of wide-bandwidth devices such as JFETs to harsh conditions can be fully enjoyed, leading to greater reliability under large surge currents and repeated switching stress, for example.

A feature of our switch topology is a new type of voltage-balancing network, which offers improved performance when there are significant leakage currents.

That is, it is a known technique to use a passive balancing network to distribute the total supply voltage across the switch in approximately equal increments, as measured between the drain and source terminals of the JFETs or other transistors. The balancing network includes a network of voltage-dividing resistors. Conduction through the balancing resistors can lead to power loss.

The power loss can be reduced by increasing the resistances in the network, as may be desirable at relatively high voltages. However, leakage currents entering the balancing resistors from the, e.g., JFET gate terminals add to the voltage drops across the resistors. The leakage currents accumulate down the chain of resistors, exacerbating the voltage drops and potentially causing harmful voltage imbalances. This problem can be made worse by increasing the resistances of the individual resistors. This is another effect that, in practice, can limit the voltage ratings that can be achieved for a switch that uses a super cascode or similar series-connected structure.

Our new switch topology is characterized by distinct parallel paths in the resistor network. This more evenly distributes the leakage currents while maintaining low power loss through the resistors.

Accordingly, the disclosed subject matter relates to a switching apparatus comprising at least a first plurality of n transistors connected in series, in which n is a positive integer at least 3. Each of the transistors has its own source, drain, and gate terminals. In non-limiting examples, the transistors may be silicon carbide or other wide-bandgap material JFETs, they may be GaN transistors, they may be normally-on devices, and they may be normally-off devices.

The first plurality of n transistors includes a first transistor $J_1$, a last transistor $J_n$, and at least one transistor $J_i$, i having respective positive integer values between 1 and n.

The switching apparatus also comprises a terminal S, also referred to herein as "Source", which is connected to the $J_1$ source terminal, a terminal D, also referred to herein as "Drain", which is connected to the $J_n$ drain terminal, and a control terminal G connected to the $J_1$ gate terminal.

The switching apparatus also comprises, connected between terminal S and terminal D, a voltage-balancing network that includes a number, at least two, of parallel-connected resistive legs. In each of the parallel-connected resistive legs, there are two or more series-connected resistors. For each transistor after $J_1$, the pertinent gate terminal connects to one of the parallel-connected resistive legs such that the parallel-connected resistive legs collectively constitute a voltage divider for dividing voltage across the series-connected transistors.

In some embodiments, there is at least one further plurality of n series-connected transistors connected between the terminal S and the terminal D.

In embodiments, the balancing network comprises, in addition to the resistive legs, at least one capacitive leg that is connected between the S terminal and the D terminal and that includes n series-connected capacitors. In embodiments, each of the n series-connected capacitors is connected between the gates of two sequential transistors $J_i$, $J_{i+1}$, except that one of the capacitors is instead connected between terminal S and the gate terminal of $J_2$, and one other of the capacitors is instead connected between the gate terminal of $J_n$ and terminal D.

In embodiments, the balancing network further comprises, in addition to the resistive legs, at least one avalanche-diode leg that includes n−1 series-connected avalanche diodes. Each of the n−1 series-connected avalanche diodes is connected between the respective gate terminals of two sequential transistors $J_i$, $J_{i+1}$, i=1, 2, . . . , n−1.

In embodiments, the number of parallel-connected resistive legs in the voltage-balancing network is two.

In embodiments, n is at least 4, and there are two parallel-connected resistive legs in the voltage-balancing network, which for convenience are here referred to arbitrarily as the "left leg" and the "right leg". For at least one positive integer i between 1 and n, a resistor of the left leg is connected between the respective gate terminal of $J_i$ and the respective gate terminal of $J_{i+2}$, and a resistor of the right leg is connected between the respective gate terminal of $J_{i+1}$ and the respective gate terminal of $J_{i+3}$.

In embodiments, there are two parallel-connected resistive legs in the voltage-balancing network, which for convenience are here referred to arbitrarily as the "left leg" and the "right leg". The respective gate terminals of transistors $J_2$ up to and including $J_n$ are alternatingly connected to the left leg or the right leg.

In embodiments, n is at least 4, and there are two parallel-connected resistive legs in the voltage-balancing network, which for convenience are here referred to arbitrarily as the "left leg" and the "right leg". In the left leg, a bottom resistor is connected between terminal S and the respective gate terminal of $J_2$, a top resistor is connected between the respective gate terminal of Jn and terminal D, and all resistors between the top and bottom resistors are connected between respective gate terminals of transistors $J_i$ wherein i is an even integer. In the right leg, a bottom resistor is connected between terminal S and the respective gate terminal of $J_3$, a top resistor is connected between the respective gate terminal of $J_{n-1}$ and terminal D, and all resistors between the top and bottom resistors are connected between respective gate terminals of transistors $J_i$ wherein i is an odd integer.

In embodiments, the number n of series-connected transistors equals four, the number of parallel-connected resistive legs in the voltage-balancing network is two, one of the two parallel-connected resistive legs includes three resistors, and the other of the two parallel-connected resistive legs includes two resistors.

In embodiments, the switching apparatus further comprises an auxiliary circuit adapted to apply a controlling voltage to terminal G for controlling a conductive state of the series-connected transistors.

Features from any of the disclosed embodiments may be used in combination with one another, without limitation. In addition, other features and advantages of the present disclosure will become apparent to those of ordinary skill in the art through consideration of the following detailed description and the accompanying drawings.

DETAILED DESCRIPTION

Figure 1:
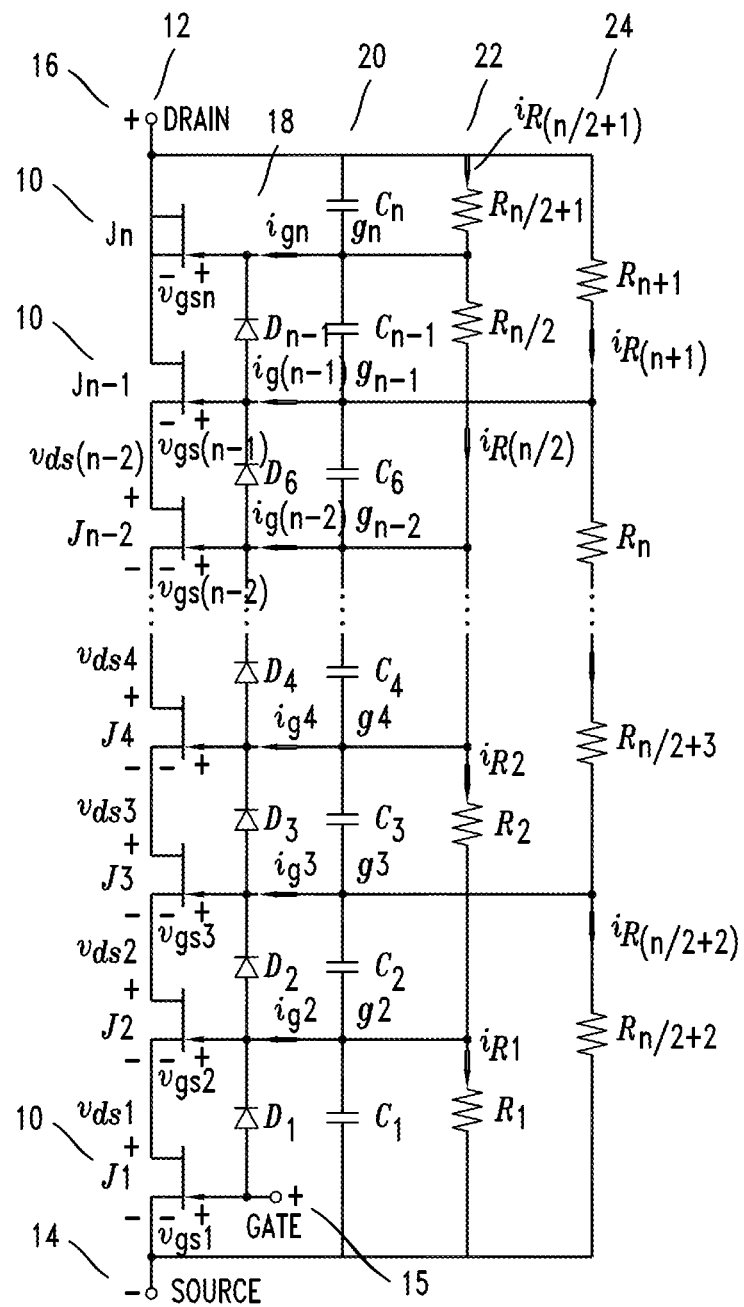
FIG. 1 is a simplified schematic diagram of a switch circuit in an example embodiment having an arbitrary number of JFETs.

FIG. 1 is a simplified schematic diagram of a switching apparatus in an example embodiment in which the transistor devices are JFETs. It should be noted, however, that although a switching apparatus based on JFETs is particularly desirable for certain applications, the choice of JFETs in the following description is not meant to be limiting. Rather, the principles described below can be implemented with any of various types of three-terminal devices, not least of which are HEMTs and other power transistors. It should also be understood that although JFETs, as in the example embodiment described here, are normally-on devices, the principles described below can be implemented using normally-off devices as well, and such implementations are within the scope of the present disclosure.

As will be seen below, the material composition of example JFETs suitable for use in an illustrative embodiment is silicon carbide. However, transistor devices of any of various semiconductor compositions, especially those formed of wide-bandgap materials, may also be suitable for use in alternate embodiments. Not least of these compositions, by way of example, are gallium nitride (GaN) and aluminum gallium nitride (AlGaN). Embodiments having any material composition suitable for implementing the principles described below are within the scope of the present disclosure.

The switching apparatus, as shown, has various applications including applications as a high-voltage circuit breaker. As shown, an integer number n of JFETs 10, exemplarily SiC JFETs, are connected in series. The minimum number for n is 3. The n JFETs 10 constitute a JFET leg 12 of the circuit. As will be explained below, the JFET leg 12 is controllable to provide blocking, between the terminals 14, 16, respectively labeled "Source" and "Drain", of a dc voltage $V_{DC}$ from a voltage source, which is not shown in FIG. 1. In other embodiments, there may be two or more JFET legs 12, as explained in more detail below.

As shown, the Source terminal 14 of the switching apparatus is connected to the source terminal of $J_1$, and the Drain terminal 16 of the switching apparatus is connected to the drain terminal of $J_n$.

Also shown in FIG. 1 is a leg 18 constituted by series-connected avalanche diodes $D_1$-$D_{n-1}$, and a leg 20 constituted by series-connected capacitors $C_1$-$C_n$. Each avalanche diode is connected between the gates of two sequential JFETs. Likewise, each capacitor is connected between the gates of two sequential JFETs, except that $C_1$ is connected between the Source terminal 14 and the gate terminal of $J_2$, and $C_n$ is connected between the gate terminal of $J_n$ and the Drain terminal 16.

The avalanche diodes are to protect the transistors (i.e., the JFETs 10, in the present example) in the event that an overvoltage greater than $V_{DC}$/n is applied across any of them. The capacitors are designed to dynamically balance the voltage during the ON and OFF transitions, which will be described below.

FIG. 1 also shows a balancing network of resistors $R_1$-$R_{n+1}$, which is connected between the Source terminal 14 and the Drain terminal 16 to balance the static voltage across the JFET leg 12. It is noteworthy that this static balancing network comprises more than one leg of series-connected resistors. The illustrated example has two legs 22, 24. One leg 22 comprises resistors $R_1$ to $R_{(n/2)+1}$, and the other leg 24 comprises resistors $R_{(n/2)+2}$ to $R_{n+1}$. In alternate embodiments, the passive balancing network may have three legs, or even more, up to a maximum of n−1.

As those skilled in the art will recognize, individual circuit elements such as transistors, resistors, and capacitors may be replaced by networks of multiple elements having equivalent function, such as serial networks, parallel networks, or serial-parallel networks, without deviating from the principles described here. Hence, any reference to an individual circuit element is meant to encompass equivalent networks of such components.

In the illustrated example, each resistor, with certain exceptions, is connected between the gates of two JFETs 10 that are separated in sequence by one intervening JFET 10, with staggering by one JFET position between the two legs 22 and 24. The exceptions are:

$R_1$ is connected between the Source terminal 14 and the $J_2$ gate terminal;

$R_{(n/2)+1}$ is connected between the $J_n$ gate terminal and the Drain terminal 16;

$R_{(n/2)+2}$ is connected between the Source terminal 14 and the $J_3$ gate terminal; and $R_{n+1}$ is connected between the $J_{n-1}$ gate terminal and the Drain terminal 16.

The gate terminals of the JFETs 10 (more specifically, the points of connection between the respective gate terminals and the capacitor leg 20) are labeled $g_2$, $g_3$, ..., $g_n$ in FIG. 1. Various voltages and currents are also labeled in FIG. 1. For convenient reference, they are defined in Table 1.

Accordingly, it will be seen that in the left resistor leg 22 (in the view of FIG. 1), the bottom resistor is connected between the Source terminal 14 and the $J_2$ gate, the top resistor is connected between the top JFET gate and the Drain terminal 16, and all other resistors are connected between gates of even-numbered JFETs. In the right leg 24 (in the view of FIG. 1), the bottom resistor is connected between the Source terminal 14 and the J3 gate, the top resistor is connected between the second-from-top JFET gate and the Drain terminal 16, and all other resistors are connected between gates of odd-numbered JFETs 10. This scheme can be implemented for n=4, and it can be extended to greater numbers of JFETs 10 and balancing resistors.

As mentioned above, alternate embodiments may include two or more JFET legs 12. For example, the entire network constituted by the JFET leg 12, the avalanche diode leg 18, the capacitor leg 20, and the resistive balancing network as represented, e.g., by resistor legs 22 and 24 of FIG. 1 can be taken as a unit and duplicated one or more times, so that two or more such units are connected in parallel between the Source terminal 14 and the Drain terminal 16. Such a parallel arrangement may be advantageous, in at least some cases, for mitigating stresses caused by high electric current. In other approaches, it may be possible to duplicate the JFET leg 12 without duplicating legs 22 and 24 of the balancing network, although such an approach would complicate the task of voltage balancing.

TABLE 1

| | |
|---|---|
| $V_{DC}$ | Supply Voltage |
| $V_{th}$ | JFET Threshold Voltage |
| $V_{G-}$ | JFET Turn-off Voltage |
| $V_{G+}$ | JFET Turn-on Voltage |
| $V_{gs}(I_0)$ | Gate-to-Source Voltage at Full Load Current |
| $v_{gs}$ | Gate-to-Source Voltage ("Gate Voltage") |
| $v_{gsi}$ | Gate-to-Source Voltage, i'th JFET |
| $v_{ds}$ | Drain-to-Source Voltage ("Drain Voltage") |
| $v_{dsi}$ | Drain-to-Source Voltage, i'th JFET |
| $i_g$ | Gate Current |
| $i_{gi}$ | Gate Current, i'th JFET |
| $i_{Ri}$ | Resistor Current, i'th Resistor |
| $i_d$ | Drain Current |
| $I_0$ | Total Load Current |
| $i_{DC}$ | The Current Through the JFET Leg |
| $R_{gi}$ | Gate Resistance, i'th JFET |
| $C_{gs}$ | Gate-to-Source Capacitance |
| $C_{gsi}$ | Gate-to-Source Capacitance, i'th JFET |
| $C_{gd}$ | Gate-to-Drain Capacitance |
| $C_{gdi}$ | Gate-to-Drain Capacitance, i'th JFET |

We will now briefly describe the operation of the switching apparatus, which for conciseness, but not for limitation, we refer to below as the "switch circuit". A more detailed discussion can be found in Luciano A. Garcia Rodriguez, et al., "A High-Voltage Cascaded Solid-State DC Circuit Breaker Using Normally-ON SiC JFETs", 2021 *IEEE 12th Energy Conversion Congress & Exposition—Asia (ECCE—*

*Asia*) (2021) 1554-1561, the entirety of which is hereby incorporated herein by reference.

Turn-ON Process. We will first describe the turn-ON process. It is noteworthy in this regard that JFETs 10 are normally-on devices. In order to maintain the switching apparatus in an OFF state, it is therefore necessary to use an ancillary circuit to supply a controlling voltage suitable to maintain the JFETs 10 in their OFF state. Such an ancillary circuit can be powered by power sources of various kinds, including, without limitation, batteries and taps from the high-voltage source. One advantage of using a high-voltage tap is that it offers assurance of continual control, even in a short-circuit event. An example of an ancillary circuit powered from a high-voltage tap will be provided below.

For purposes of discussion, we take the steady-state OFF condition of the switch circuit as the initial condition. In this OFF condition, the total dc voltage $V_{DC}$ is divided evenly among the n JFETs 10. The gate-to-source voltages (referred to below as "gate voltages") of the JFETs 10 are at a level slightly below the threshold voltage $V_{th}$, except for $V_{gs1}$, which is at a subthreshold voltage $V_{G-}$; i.e., $V_{G-} < V_{th}$. The voltage across each balancing capacitor is $V_{DC}/n$, except that the voltages across $C_1$ and $C_n$ are $V_{DC}/n + V_{th}$ and $V_{DC}/n - V_{th}$, respectively. Due to their high values, the balancing resistors $R_1$ to $R_{n+1}$ have no significant effect on the turn-ON and turn-OFF processes. Hence, we treat them as open circuits in the following discussion.

Figure 2:
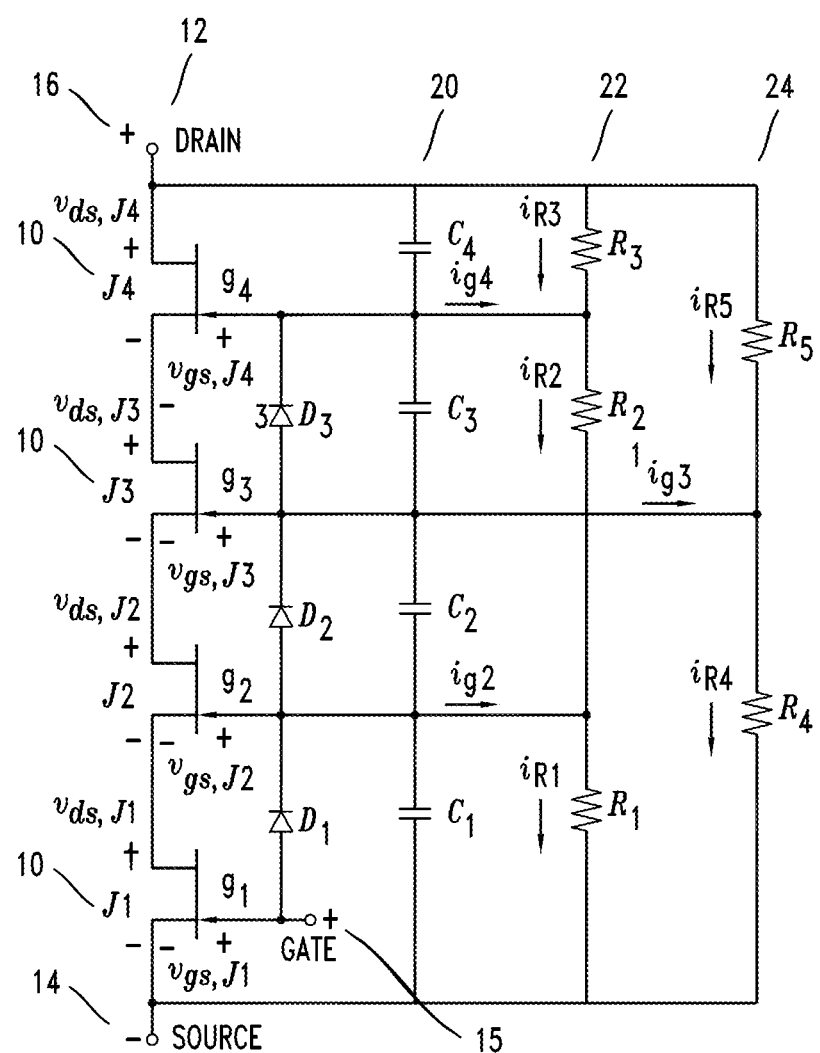
FIG. 2 is a simplified schematic diagram of a switch circuit in an example embodiment having four JFETs.

For simplicity of presentation, the following analysis is directed to an illustrative embodiment in which there are four JFETs 10, denominated $J_1$, $J_2$, $J_3$, and $J_4$, respectively. The corresponding circuit diagram is shown in FIG. 2. Figure elements that are common to FIGS. 1 and 2 are identified using like reference numerals.

Figure 3:
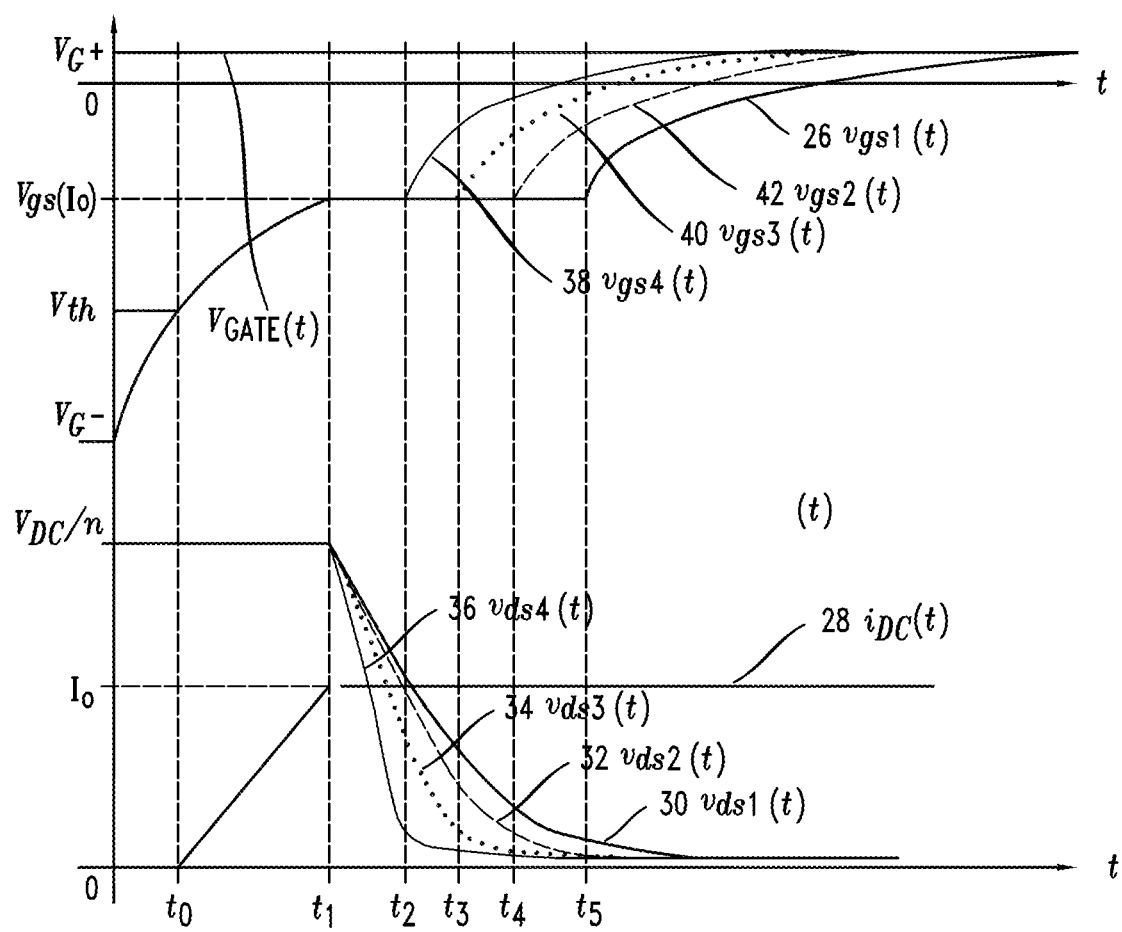
FIG. 3 is a graph of the predicted waveforms of the respective gate-to-source and drain-to-source voltages of the respective JFETs during the turn-ON process of an illustrative switch circuit. The predicted waveform of the current $i_{DC}$ in the switch circuit is also shown.

We performed a modeling study to predict the waveforms during the turn-ON process for the respective gate and drain voltages, as well as for the current $i_{DC}$ through the JFET leg 12. The model that we used assumes an inductive load, as is common practice for modeling the behavior of power converters, although in practical applications, the load can have any combination of inductive, capacitive, and resistive components. Our model includes a free-wheeling diode together with the inductive load, in accordance with the well-known double pulse test (DPT) circuit configuration. Results of our modeling study, indicative of switching behavior, are shown in FIG. 3, to which attention will be drawn in the following discussion.

Interval 0, from t=0 to t=$t_0$. The process is initiated by raising the voltage $v_{Gate}$ applied to control terminal 15 (i.e., the terminal "Gate" connected to the $J_1$ gate terminal) to the steady value $V_{G+}$, which will typically be several volts, for example 3V. This causes the voltage $v_{gs1}$ to begin rising from its initial value $V_{G-}$, while $v_{ds1}$ remains constant at $V_{DC}/4$. The capacitances $C_{ds}$, $C_{gs}$, and $C_{gd}$, which are not expressly indicated in FIGS. 1 and 2, are inherent properties of the JFET devices.

The $J_1$ gate current, $i_{g1}$, conducts through $C_{gs1}$ to the Source terminal 14, and it also conducts through $C_{gd1}$. Because $C_{gd1}$ is much smaller than $C_{gs1}$, the effect of $C_{gd1}$ is neglected in this analysis. Because the drain-to-source capacitances of the JFETs 10 are also very small, their effects are likewise neglected in this analysis.

An analytical calculation yields the following expression for the evolution of the $J_1$ gate voltage in this interval:

$$v_{gs1} = V_{G+} + (V_{G-} - V_{G+}) \cdot \exp(-t/(R_{g1}C_{gs1})). \quad (I)$$

The time interval 0 ends at time $t_0$, when $v_{gs1}$ reaches the threshold value $V_{th}$. The time $t_0$ is given by:

$$t_0 = R_{g1}C_{gs1} \ln[(V_{G-} - V_{G+})/(V_{th} - V_{G+})]. \quad (II)$$

Turning to FIG. 3, it will be seen (curve 26) that $v_{gs1}$ has begun to rise, starting at t=0, and that at t=$t_0$, the curve representing $v_{gs1}$ crosses the level marked $V_{th}$.

Interval 1, from t=$t_0$ to t=$t_1$. When t>$t_0$, all JFETs 10 have a gate voltage greater than $V_{th}$, so they all begin to conduct, as indicated by the rise in curve 28, which is the curve for $i_{DC}$ in FIG. 3. The reason for this is that when $J_1$ reaches threshold, its channel begins to conduct current, causing a small decrease in the $J_1$ drain voltage. According to the series connection of the JFET leg 12, the $J_1$ drain terminal is connected to the $J_2$ source terminal. Hence, the voltage drop at the $J_1$ drain terminal raises the $J_2$ gate voltage relative to the voltage at the $J_2$ source terminal. This change raises the $J_2$ gate voltage above threshold and causes $J_2$ to conduct. The same process continues to propagate very rapidly up the JFET leg 12 in a chain reaction until all JFETs 10 are conducting.

For all of the JFETs 10, the drain voltage $v_{ds}$ is now greater than $v_{gs} - V_{th}$, which places all of the JFETs 10 in the saturation region. Hence, the drain current $i_d$ of each JFET 10 is given by:

$$i_d = g_m(v_{gs} - V_{th}), \quad (III)$$

where $g_m$ is the JFET transconductance.

Since all JFETs 10 have the same current $i_d = i_{DC}$, the gate voltages $v_{gs}$ are also equal, assuming that the JFETs 10 are identical. Interval 1 ends at time $t_2$, when $i_d = I_0$. Analytical calculations predict the duration of Interval 1 as:

$$t_1 - t_0 = R_{g1}C_{gs1} \ln[(V_{th} - V_{G+})/((I_0/g_m) + V_{th} - V_{G+})]. \quad (IV)$$

Turning to FIG. 3, it will be seen that $i_{DC}$ rises linearly in Interval 1. The drain voltages of all of the JFETs 10, respectively represented in figure by curves 30, 32, 34, and 36, remain steady at $V_{DC}/4$.

Interval 2, from t=$t_1$ to t=$t_5$. The switch circuit has begun to conduct the entire load current $I_0$, while the gate voltages $v_{gs}$ of all JFETs 10 remain constant at $V_{gs}(I_0)$, as seen in FIG. 3. All JFETs are still in the saturation region. Analytical calculations predict $V_{gs}(I_0)$ as:

$$V_{gs}(I_0) = I_0/g_m + V_{th}. \quad (V)$$

The gate currents flow entirely through the gate-to-drain capacitances of the JFETs 10, and there is no current through the gate-to-source capacitances. While the JFETs 10 are operating in saturation, the discharge of the gate-to-drain capacitances reduces the drain voltages $v_{ds}$ linearly, as seen in FIG. 3 (curves 30, 32, 34, 36).

The well-known condition for JFET operation in the triode region is that the gate voltage is greater than the sum of the drain voltage and the threshold voltage. The time $t_2$ occurs when $J_4$ enters the triode region, i.e., when $v_{ds4} = v_{gs4} - V_{th}$. At that point, the $J_4$ gate voltage starts to rise, as shown by curve 38 in FIG. 3. Similar behavior is seen in $J_3$ (curve 40), $J_2$ (curve 42), and $J_1$ (curve 26) as they enter the triode region at times $t_3$, $t_4$, and $t_5$, respectively.

Interval 3, t>$t_5$. All JFETs 10 are operating in the triode region. The gate currents decay to zero, and the gate voltages 26, 38, 40, 42 decay to $V_{G+}$. At that point, the JFET leg 12 is fully ON.

Figure 4:
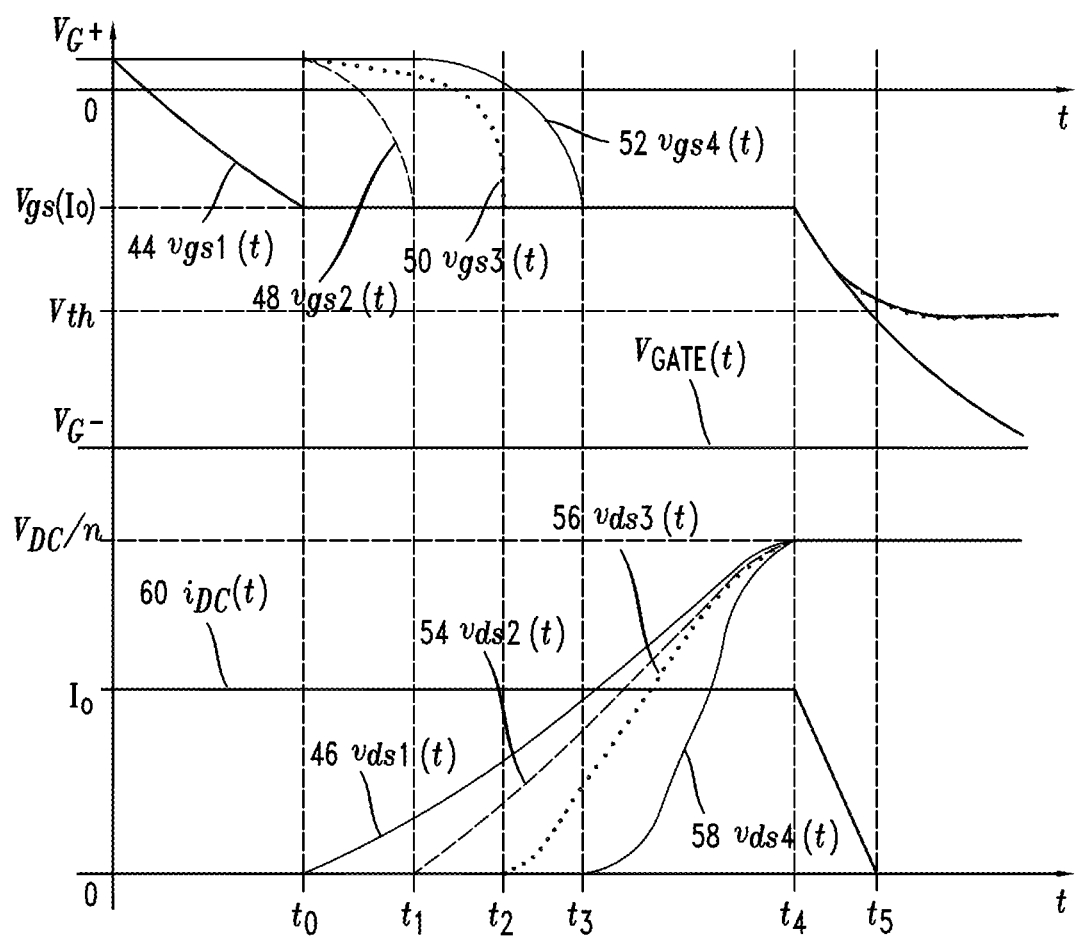
FIG. 4 is a graph of the predicted waveforms of the respective gate-to-source and drain-to-source voltages of the respective JFETs during the turn-OFF process of an illustrative switch circuit. The predicted waveform of the current $i_{DC}$ in the switch circuit is also shown.

Turn-OFF Process. Our modeling study also predicted the waveforms during the turn-OFF process. The results are shown in FIG. 4, to which attention will be drawn in the following discussion.

Interval 0, from t=0 to t=$t_0$. As the initial state, we take a steady state in which the JFET leg 12 is fully ON and is conducting the load current $I_0$, and in which $v_{ds} \cong 0$, and $v_{gs} \cong V_{G+}$ for all JFETs 10. The turn-OFF transition starts when a negative voltage $V_{G-}$ lower than the threshold voltage $V_{th}$ is applied between the Gate and Source 14 terminals of the switch circuit.

The response of the $J_1$ gate voltage, as predicted by analytical calculations, is:

$$v_{gs1} = V_{G-} + (V_{G+} - V_{G-}) \cdot \exp(-t/R_{g1}(C_{gs1} + C_{gd1})). \quad \text{(VI)}$$

As shown in FIG. 4, $v_{gs1}$ (curve 44) decays exponentially until, at time $t_0$, a constant voltage level equal to $V_{gs}(I_0)$ is reached and $J_1$ enters the saturation region. Analytical calculations predict a value for $t_0$ given by:

$$t_0 = R_{g1}(C_{gs1} + C_{gd1}) \ln \left[ (V_{G+} - V_{G-}) / ((I_0/g_m) + V_{th} - V_{G-}) \right]. \quad \text{(VII)}$$

Interval 1, from $t=t_0$ to $t=t_1$. $J_1$ begins to operate in the saturation region while the other JFETs 10 are still operating in the triode region. As the $J_1$ drain voltage $v_{ds1}$ (curve 46) starts to rise at $t_0$, the gate voltages of $J_2$, $J_3$ and $J_4$ (curves 48, 50, and 52, respectively) start to decrease, as shown in FIG. 4. By analytical calculation, we predict a linear rise in the $J_1$ drain voltage, according to:

$$v_{ds1} = [(I_0/g_m + V_{th} - V_{G-})/R_{g1}C_{dg1}](t - t_0). \quad \text{(VIII)}$$

Interval 1 ends at time $t_1$, where $v_{gs2}$ has decayed to the value $V_{gs}(I_0)$, and $v_{ds2}$ (curve 54) starts to rise.

Interval 2, from $t=t_1$ to $t=t_3$. The operation during the time intervals $[t_1-t_2]$ and $[t_2-t_3]$ is analogous to the operation during the interval $[t_0-t_1]$. As shown in FIG. 4, $t_2$ and $t_3$ are the time instants when the gate voltage of $J_3$ (curve 50) and the gate voltage of $J_4$ (curve 52) respectively decay to $V_{gs}(I_0)$.

The $J_3$ drain voltage (curve 56) rises to $V_{DC}/4$ at time $t_2$, and the $J_4$ drain voltage (curve 58) rises to $V_{DC}/4$ at time $t_3$.

Interval 3, from $t=t_3$ to $t=t_4$. In this interval, all JFETs 10 are operating in saturation with their gate voltages clamped to $V_{gs}(I_0)$. This interval ends when the voltage across Drain 16 and Source 14 terminals equals $V_{DC}$. Analytical calculation yields the following expression for $t_4$:

$$t_4 = [(R_{g1}C_{gd1}V_{DC}/n)/((I_0/g_m) + V_{th} - V_{G-})] + t_0. \quad \text{(IX)}$$

Interval 4, for $t > t_4$. As noted above, our model assumes there is a free-wheeling diode connected across the switch circuit. In Interval 4, the free-wheeling diode conducts, clamping the voltage across the switch circuit at $V_{DC}$. When the gate voltages 44, 48, 50, 52 of the JFETs 10 reach the threshold voltage $V_{th}$, the current $i_{DC}$ (curve 60) in the switch circuit falls to zero. The gate voltages 48, 50, 52 of all JFETs 10 remain close to $V_{th}$, except for $v_{gs1}$ (curve 44), which continues to decay to $V_{G-}$.

Steady-State Operation. Resistors $R_1$ to $R_{n+1}$ form the resistive balancing network of the switch circuit of FIG. 1. The main objective for this network is to maintain a stable and evenly distributed voltage across each JFET 10, particularly during the OFF state. Voltage mismatches can occur in serial connections of devices, due to parasitic resistances and parasitic capacitances that cannot be completely controlled for during device manufacture. Additionally, the resistive balancing between gate terminals of the cascaded JFETs 10 is subject to further voltage imbalance due to gate leakage currents.

For example, the leakage currents in the resistors of FIG. 1 contribute to a total current in resistor $R_1$ given by:

$$i_{R1} = i_{R(\frac{n}{2}-1)} - \sum_{k'=2}^{n} i_{gk'}, \quad \text{(X)}$$

with the summation taken only over even values of k'.

The sensitivity $S_{i_{gk}}^{i_{R1}}$ of $i_{R1}$ with respect to the $J_k$ gate leakage current can be calculated according to the following formula:

$$S_{i_{gk}}^{i_{R1}} = -\frac{i_{gk}}{i_{R(\frac{n}{2}-1)} - \sum_{k'=2}^{n} i_{gk'}} \text{ if } k \text{ even}, \quad \text{(XI)}$$

$$S_{i_{gk}}^{i_{R1}} = 0 \text{ if } k \text{ odd},$$

with the summation taken only over even values of k'.

It will be understood from the above formula that the sensitivity of the bottom resistor is affected by the gate currents from the upper JFETs 10, and that increasing the total number of JFETs 10 tends to increase the sensitivity. However, the above formula also suggests that the sensitivity tends to be low when the leakage currents are low and when the currents through the balancing resistors are high.

It should also be noted that here, the summation is taken only over the gate currents of the even-numbered JFETs 10. This leads to a relatively low value for the sensitivity. This limited summation is a consequence of the, e.g., dual-leg topology, in which the odd-numbered JFETs 10 do not contribute to the sensitivity. This is in contrast to conventional resistive balancing networks that use only a single resistor leg.

Circuit Breaker Architecture

Figure 5:
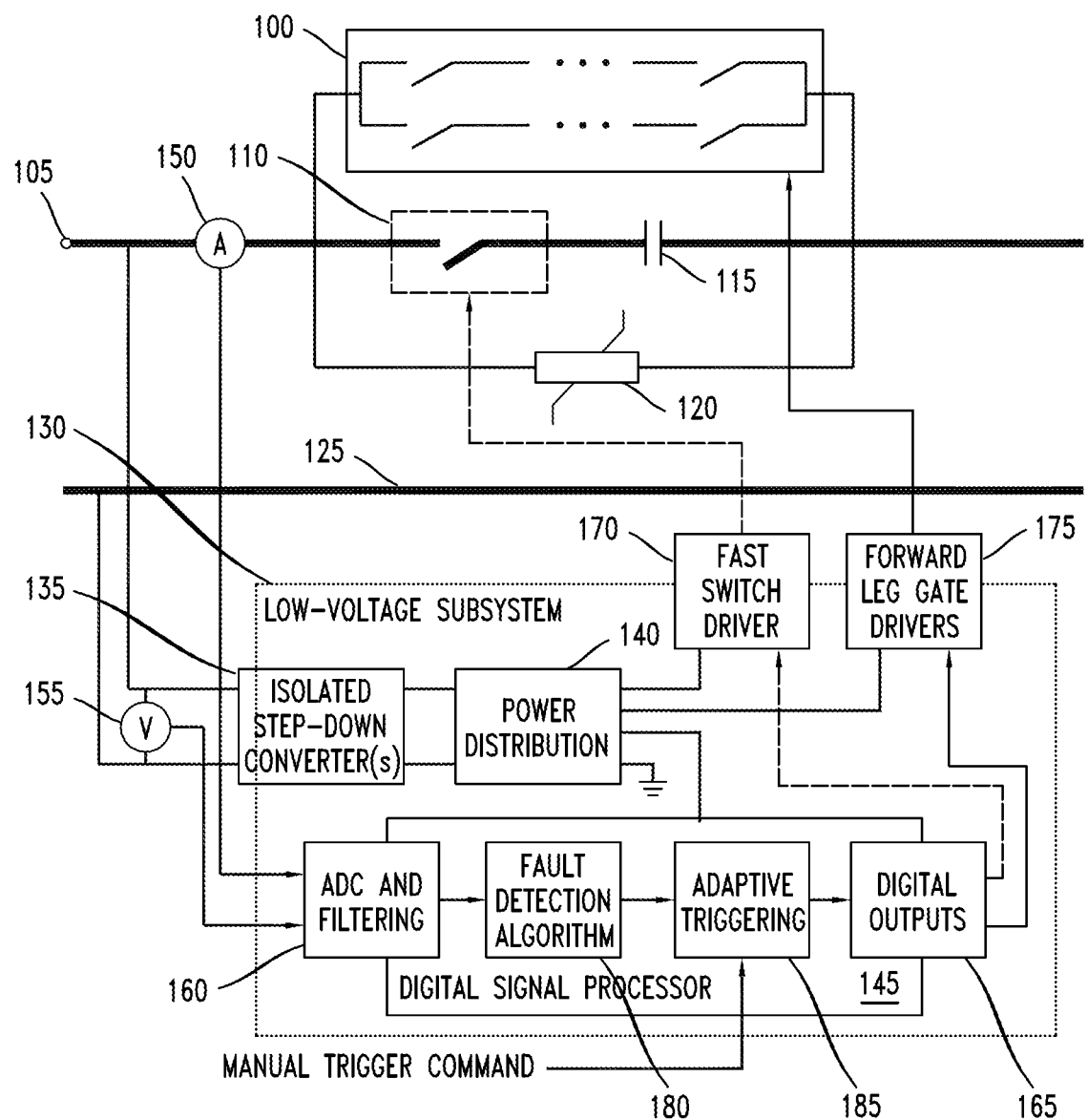
FIG. 5 is a block diagram illustrating an architecture for a breaker circuit incorporating the switch circuit described here, in an example embodiment.

For purposes of illustration, FIG. 5 provides a functional block diagram of an example architecture for a high-voltage breaker circuit that incorporates the switch circuit of the present disclosure. As shown in FIG. 5, switch circuit 100 is connected in series on high-voltage bus 105. Fast switch 110 and energy-absorbing capacitor 115 are connected in parallel with the switch circuit 100 to absorb and dissipate power spikes when the switch circuit 100 changes state. A snubber circuit 120 is connected in parallel with the switch circuit 100 for protection against overvoltages. The energy-dissipating element in the snubber circuit 120 is shown here as a varistor, but alternative components could be used instead, such as a free-wheeling diode as discussed above. The load, which is not shown in FIG. 5, would be connected between the high-voltage bus 105 and the ground bus 125.

Control for the breaker circuit is provided by low-voltage subsystem 130. As shown, an isolated step-down converter 135 and a power-distribution circuit 140 tap power from the high-voltage bus 105, step it down to a low voltage, and distribute it within the low-voltage subsystem 130 to components including digital signal processor (DSP) 145. The inputs to the DSP 145 include signals from current monitor 150 and voltage monitor 155, and the outputs include digital control signals for the switch circuit 100 and for fast switch 110. As shown in FIG. 5, the input to the DSP 145 is conditioned by module 160, which performs analog-to-digital conversion and filtering. The output is conditioned by digital output module 165, which generates the signals that trigger driver circuit 170 for the fast switch 110 and forward leg gate-driver circuit 175 for the switch circuit 100. The forward leg gate-driver circuit 175, with its controls and power supply, is an example of the ancillary circuit mentioned above for maintaining the JFETs 10 of the switch circuit 100 in their OFF state when desired.

The DSP 145 implements fault-detection algorithm 180 to determine, in response to the current and voltage signals, whether a fault has occurred. Adaptive triggering module 185 within the DSP 145 responds to a fault detection by activating the trigger signals.

In an example scenario, detection of a fault condition is followed by generation of a trigger signal that turns the JFETs 10 of the switch circuit 100 off. This is followed by a trigger signal that closes the fast switch 110 so that excess power is diverted into the snubber circuit 120 and dissipated there.

Example

We constructed a 1.2 kV/10 A prototype switch circuit with the topology of FIG. 2. The design parameters are listed in Table 2.

The SiC JFETs 10 selected for our prototype are UJ3N120035K3S JFETs from United SiC. These devices can be driven with voltages within the range $-20V<v_{gs}<3V$. We selected driving voltages of $V_{G+}=1V$ for turning ON, and $V_{G-}=-18V$ for turning OFF. For a gate driver, IC, we selected the UCC5390ECQDWVRQ1 integrated circuit from Texas Instruments. This device provided 10 A of source and sink driving current capability.

For testing, we used a Magnapower TSD2000-15 dc voltage source, which is rated at 2 kV, 15 A and 30 kW, and a Chroma 63224A-1200-960 high-power dc electronic load, which is rated at 1.2 kV, 960 A and 24 kW. An auxiliary Keithley 2280S-32-6 power supply provided power to the gate-driver circuit. A BK Precision 4080B function generator was used to provide a trigger gating signal. A Tektronix 5-Series 8-Channels, 350 MHz oscilloscope was used for experimental readout.

The values of the balancing resistors $R_1$ to $R_5$ were selected to maintain a stable dc voltage across the resistor left and right legs 22, 24. The steady-state voltages across the resistors, as can be inferred from FIG. 2, are:

$$v_{R1}=v_{g2}, \tag{XII}$$

$$v_{R2}=v_{g4}-v_{g2}, \tag{XIII}$$

$$v_{R3}=V_{Drain}-v_{g4}, \tag{XIV}$$

$$v_{R4}=v_{g3}, \tag{XV}$$

$$v_{R5}=V_{Drain}-v_{g3}. \tag{XVI}$$

The gate voltages are calculated, assuming that the resistor left and right legs 22, 24 is perfectly balanced, as:

$$v_{gi}=[(i-1)/n]+V_{th},\ 1\le i\le n. \tag{XVII}$$

The JFET threshold voltage $V_{th}$ in this example is $-11.5V$.

Based on the desired maximum power dissipation $P_{dmax}$ of the passive network, the currents through the bottom resistors $R_1$ and $R_4$ were arbitrarily selected as:

$$i_{R1}=i_{R4}=I_R\cong P_{dmax}/\Sigma_{i=1}^n v_{R1}. \tag{XVIII}$$

Then, by considering the gate leakage currents $i_{g2}$–$i_{g4}$, the currents though resistors $R_2$, $R_3$ and $R_5$ are obtained as:

$$i_{R2}=I_R-i_{g2}, \tag{XIX}$$

$$i_{R3}=I_R-i_{g2}-i_{g4},\text{ and} \tag{XX}$$

$$i_{R5}=I_R-i_{g3}. \tag{XXI}$$

Then, the balancing resistors can be calculated as:

$$R_i=v_{Ri}/i_{Ri},\ 1\le i\le n. \tag{XXII}$$

The capacitors $C_1$ to $C_4$ improve the dynamic performance and prevent voltage spikes across the drain-to-source terminals of the JFETs 10. Published formulas can be used to estimate the capacitor values; the estimated values can then be adjusted using simulation tools.

Figure 6:
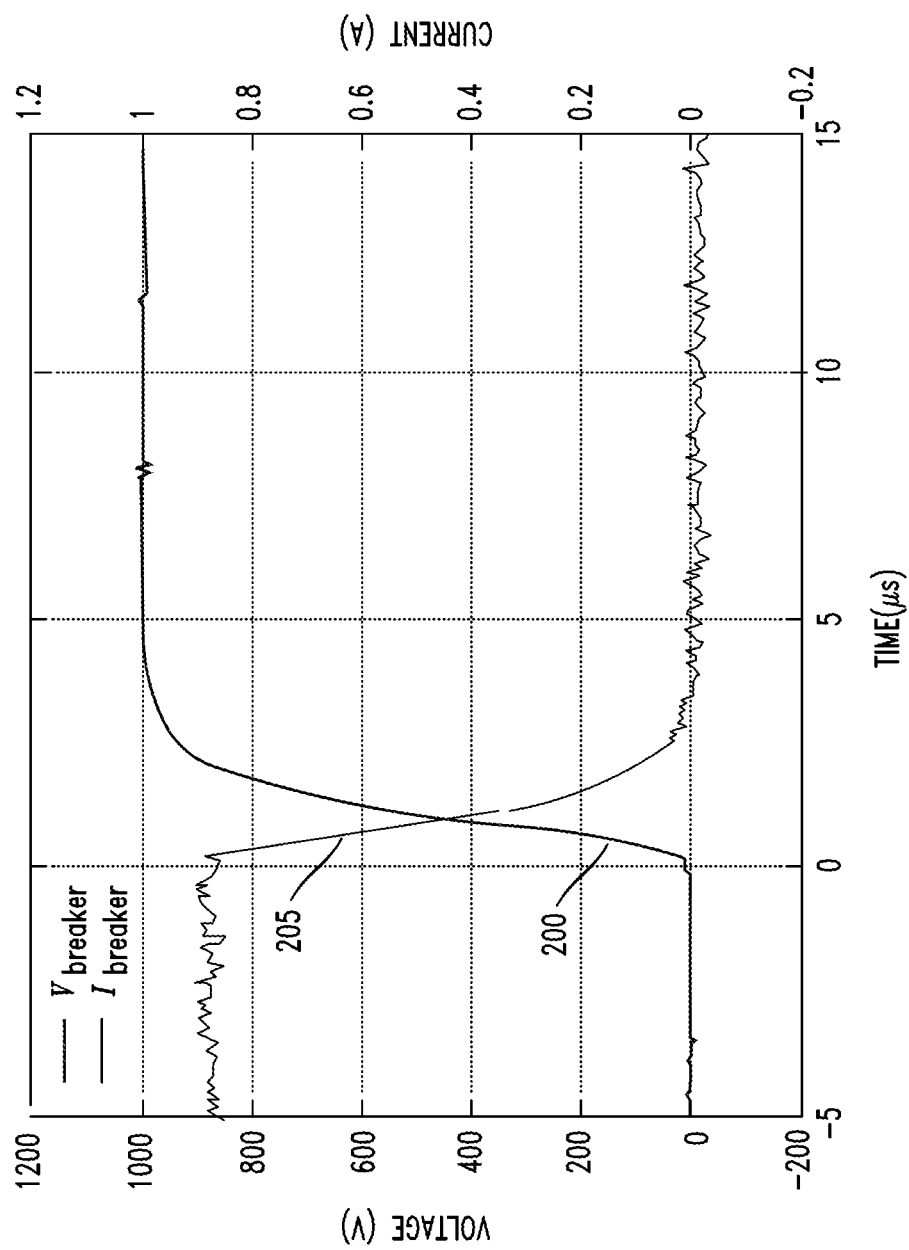
FIG. 6 is a graph of the experimentally measured voltage versus time across a prototype switch circuit ("$V_{breaker}$") and the experimentally measured current versus time through the prototype switch circuit during a turn-OFF transition.

FIG. 6 is a graph of the voltage 200 across the switch circuit ("$V_{breaker}$") and the current 205 through the switch circuit ("$I_{breaker}$") versus time during a turn-OFF transition of our prototype when under test. It can be seen that the turn-OFF transition takes about 2 µs.

Figure 7:
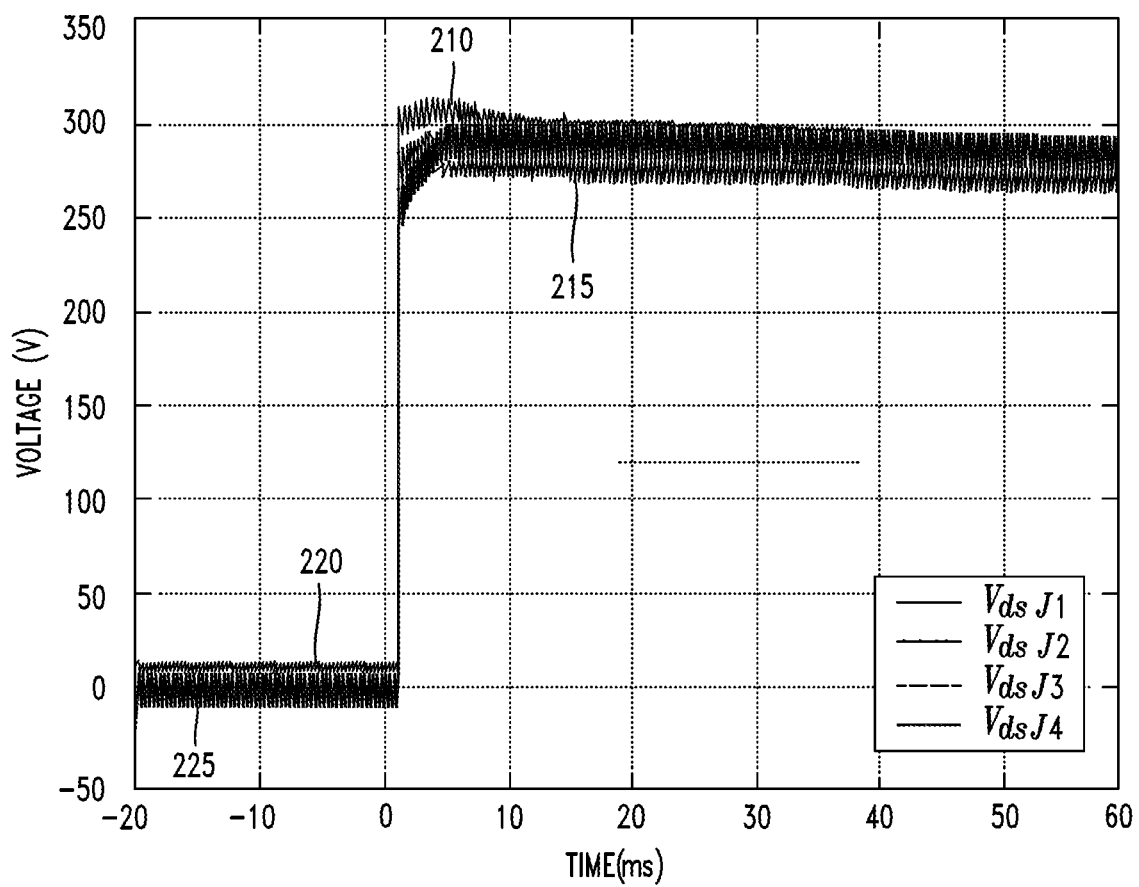
FIG. 7 is a composite graph of the experimentally measured drain-to-source voltages versus time of the respective JFETs $J_1$ to $J_4$ of a prototype switch circuit.
Figure 8:
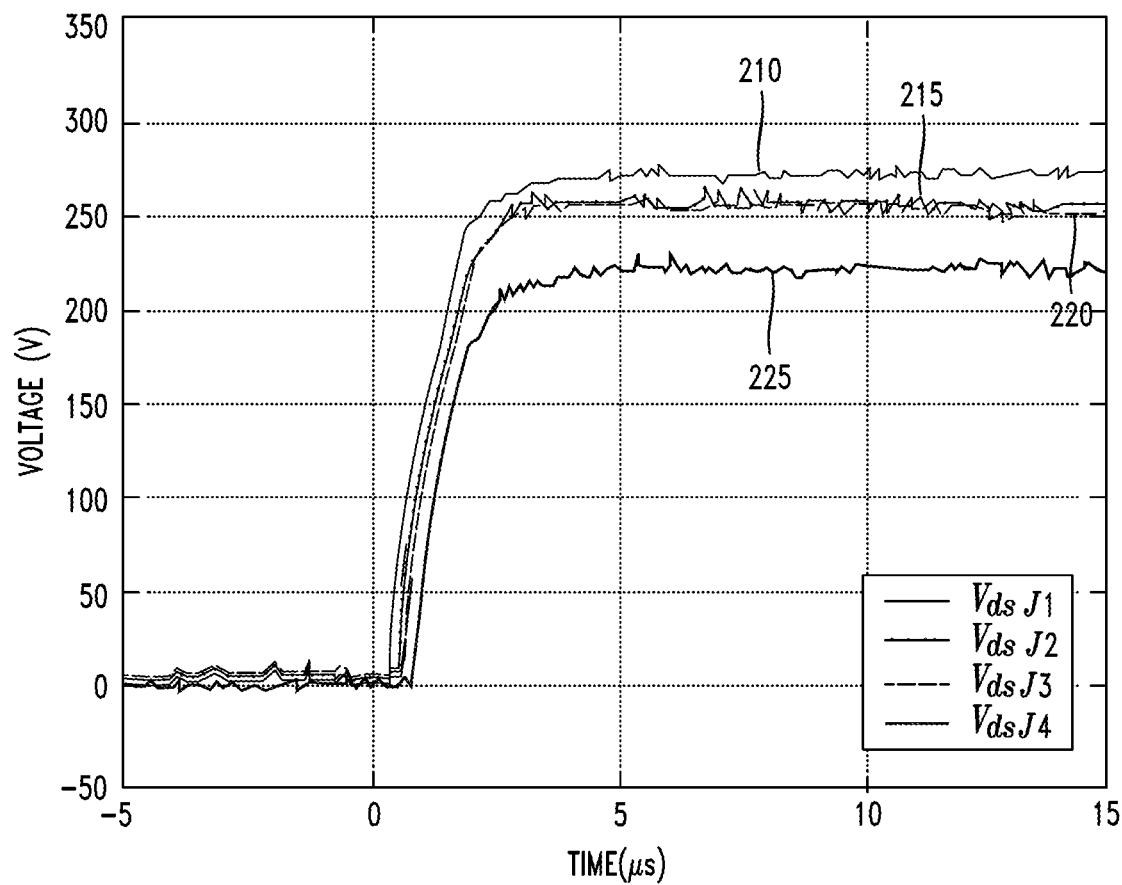
FIG. 8 is a portion of the preceding figure, showing the drain-to-source voltages over an expanded timescale.

FIG. 7 is a composite graph of the drain-to-source voltages of the respective JFETs $J_1$ (curve 210), $J_2$ (curve 215), $J_3$ (curve 220), and $J_4$ (curve 225) as functions of time over an 80-ms timescale. The graph indicates that the balancing network operated successfully. FIG. 8 is a portion of FIG. 7, showing the drain-to-source voltages over an expanded timescale spanning 20 µs. No transient voltage spikes are seen in FIG. 8. This indicates that the capacitance network was well balanced.

Figure 9:
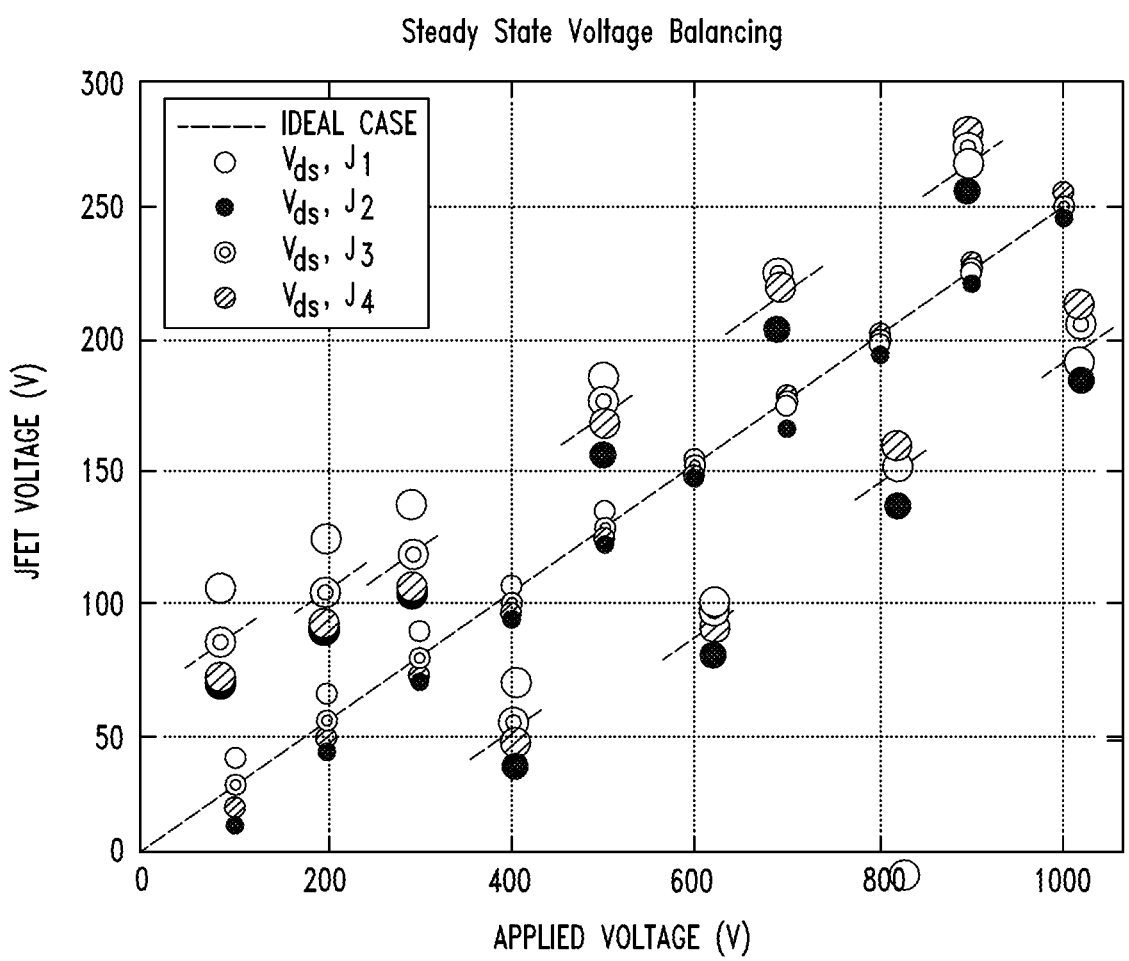
FIG. 9 is a graph that illustrates the distribution of steady-state drain-to-source voltages of the respective JFETs in a prototype switch circuit at ten different applied voltages.

FIG. 9 illustrates the distribution of steady-state drain-to-source voltages over the JFET leg 12 when the prototype was subjected to different applied voltages. At each of ten applied voltages ranging from 100V to 1000V, the respective steady-state drain-to-source voltage is plotted for each of the four JFETs 10 as a cluster of data points. Because the data points are difficult to distinguish on the scale of the plot, a magnified view of each cluster is also provided. It will be evident from FIG. 9 that there is only a small divergence in voltage among the four JFETs 10. This indicates that the dc bus voltage is divided evenly in all devices, even at relatively low voltages.

TABLE 2

| 1.2 kV/10 kV SiC JFET Super Cascode Parameters | |
|---|---|
| Balancing Resistors | |
| $R_1$ | 288.5 kΩ |
| $R_2$ | 628.81 kΩ |
| $R_3$ | 341 kΩ |
| $R_4$ | 288.5 kΩ |
| $R_5$ | 638.7 kΩ |
| Balancing Capacitors | |
| $C_1$ | 2.9 nF |
| $C_2$ | 2.35 nF |
| $C_3$ | 1.8 nF |
| $C_4$ | 1.25 nF |
| Gate Resistors | |
| $R_{g1}$, $R_{g2}$, $R_{g3}$, $R_{g4}$ | 15 Ω |
| SiC JFETs | |
| $J_1$, $J_2$, $J_3$, $J_4$ | United SiC-UJ3N120035K3S 1200V/46A @ 100° C. |
| Avalanche Diodes | |
| $D_1$, $D_2$, $D_3$ | Vishay-BYG20J-E3/TR 600V/1.5A |

The invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

We claim:

1. A switching apparatus, comprising:
   at least a first plurality of n series-connected transistors, each of said transistors having a respective source terminal, a respective drain terminal, and a respective gate terminal, wherein for n a positive integer at least 3, the first plurality of n series-connected transistors includes a first transistor herein denominated $J_1$, a last transistor herein denominated $J_n$, and at least one transistor herein denominated $J_i$, i having respective positive integer values between 1 and n;

a terminal S connected to the $J_1$ source terminal;

a terminal D connected to the $J_n$ drain terminal;

a control terminal G connected to the $J_1$ gate terminal; and a voltage-balancing network connected between terminal S and terminal D;

wherein the voltage-balancing network includes a number, at least two, of parallel-connected resistive legs;

wherein each parallel-connected resistive leg includes two or more series-connected resistors; and wherein for each transistor after $J_1$, the pertinent gate terminal connects to one of the parallel-connected resistive legs such that the parallel-connected resistive legs collectively constitute a voltage divider for dividing voltage across the series-connected transistors.

2. The switching apparatus of claim 1, wherein the transistors $J_1, \ldots, J_n$ are JFETs.

3. The switching apparatus of claim 1, wherein the transistors $J_1, \ldots, J_n$ are silicon carbide or other wide-bandgap material JFETs.

4. The switching apparatus of claim 1, wherein the transistors $J_1, \ldots, J_n$ are normally-on transistors.

5. The switching apparatus of claim 1, wherein the transistors $J_1, \ldots, J_n$ are normally-off transistors.

6. The switching apparatus of claim 1, wherein the transistors $J_1, \ldots, J_n$ are GaN transistors.

7. The switching apparatus of claim 1, comprising at least one further plurality of n series-connected transistors connected between the terminal S and the terminal D.

8. The switching apparatus of claim 1, wherein:

the balancing network further comprises at least one capacitive leg connected between the terminal S and the terminal D; and the at least one capacitive leg comprises n series-connected capacitors $C_1, \ldots, C_n$.

9. The switching apparatus of claim 8, wherein each of the n series-connected capacitors $C_1, \ldots, C_n$ is connected between the gates of two sequential transistors $J_i$, $J_{i+1}$, except that one of the capacitors is instead connected between the terminal S and the gate terminal of $J_2$, and one other of the capacitors is instead connected between the gate terminal of $J_n$ and the terminal D.

10. The switching apparatus of claim 8, wherein:

the balancing network further comprises at least one avalanche-diode leg;

the at least one avalanche diode leg comprises n−1 series-connected avalanche diodes; and each of the n−1 series-connected avalanche diodes is connected between the respective gate terminals of two sequential transistors $J_i$, $J_{i+1}$, i=1, 2, . . . , n−1.

11. The switching apparatus of claim 1, wherein the number of parallel-connected resistive legs in the voltage-balancing network is two.

12. The switching apparatus of claim 11, wherein n is at least 4, and wherein, for at least one positive integer i at least 1 and not more than n−3:

a resistor of one of the two parallel-connected resistive legs is connected between the respective gate terminal of $J_i$ and the respective gate terminal of $J_{i+2}$; and a resistor of the other of the two parallel-connected resistive legs is connected between the respective gate terminal of $J_{i+1}$ and the respective gate terminal of $J_{i+3}$.

13. The switching apparatus of claim 11, wherein the respective gate terminals of transistors $J_2$ up to and including $J_n$ are alternatingly connected to a respective one or the other of the two parallel-connected resistive legs.

14. The switching apparatus of claim 11, wherein n is at least 4, and wherein:

in one of the two parallel-connected resistive legs, a bottom resistor is connected between the terminal S and the respective gate terminal of $J_2$, a top resistor is connected between the respective gate terminal of $J_n$ and the terminal D, and all resistors between the top and bottom resistors are connected between respective gate terminals of transistors $J_i$ wherein i is an even integer; and in the other of the two parallel-connected resistive legs, a bottom resistor is connected between the terminal S and the respective gate terminal of $J_3$, a top resistor is connected between the respective gate terminal of $J_{n-1}$ and the terminal D, and all resistors between the top and bottom resistors are connected between respective gate terminals of transistors $J_i$ wherein i is an odd integer.

15. The switching apparatus of claim 1, wherein:

the number n of series-connected transistors equals four;

the number of parallel-connected resistive legs in the voltage-balancing network is two;

one of the two parallel-connected resistive legs comprises three resistors; and the other of the two parallel-connected resistive legs comprises two resistors.

16. The switching apparatus of claim 1, further comprising an auxiliary circuit adapted to apply a controlling voltage to the control terminal G for controlling a conductive state of the series-connected transistors.

* * * * *